US010892617B2

United States Patent
Edwards et al.

(10) Patent No.: US 10,892,617 B2
(45) Date of Patent: Jan. 12, 2021

(54) HIGH SPEED WIDE DYNAMIC RANGE INPUT STRUCTURE

(71) Applicant: NXP USA, Inc., Austin, TX (US)

(72) Inventors: William E. Edwards, Washtenaw, MI (US); John M. Pigott, Phoenix, AZ (US)

(73) Assignee: NXP USA, Inc., Austin, TX (US)

(*) Notice: Subject to any disclaimer, the term of this patent is extended or adjusted under 35 U.S.C. 154(b) by 146 days.

(21) Appl. No.: 16/368,022

(22) Filed: Mar. 28, 2019

(65) Prior Publication Data

US 2020/0313425 A1    Oct. 1, 2020

(51) Int. Cl.
*H02H 9/04* (2006.01)
*H02H 1/00* (2006.01)
*H03K 19/0175* (2006.01)

(52) U.S. Cl.
CPC ............ *H02H 9/04* (2013.01); *H02H 1/0007* (2013.01); *H02H 9/046* (2013.01); *H03K 19/017509* (2013.01)

(58) Field of Classification Search
CPC ........ H02H 9/04; H02H 9/046; H02H 1/0007; H02H 3/20; H03K 19/017509; H01L 27/0285
USPC ...................................... 361/91.1, 91.5, 91.6
See application file for complete search history.

(56) References Cited

U.S. PATENT DOCUMENTS

| | | | | |
|---|---|---|---|---|
| 3,529,211 | A | * | 9/1970 | Elwin .................... H02J 7/166 361/91.6 |
| 4,633,283 | A | * | 12/1986 | Avery ................. H01L 27/0248 257/122 |
| 4,772,979 | A | * | 9/1988 | Arras .................. H03K 17/6874 361/101 |
| 5,319,259 | A | | 6/1994 | Merrill |
| 6,069,493 | A | | 5/2000 | Pigott et al. |
| 6,346,829 | B1 | | 2/2002 | Coddington |
| 9,118,180 | B2 | * | 8/2015 | Yasuda .................. H02H 9/046 |
| 9,837,973 | B2 | | 12/2017 | Brantley et al. |
| 10,256,811 | B2 | * | 4/2019 | Chang .................. H03K 17/693 |
| 10,270,438 | B2 | * | 4/2019 | Huang ................. H03K 17/687 |
| 2012/0262220 | A1 | | 10/2012 | Springett |
| 2015/0042177 | A1 | | 2/2015 | Weyers et al. |

(Continued)

FOREIGN PATENT DOCUMENTS

DE    3816476 C1    9/1989

*Primary Examiner* — Yemane Mehari

(57) ABSTRACT

An input protection circuit (200) and associated method are disclosed for protecting a circuit input ($V_{INP}$) from positive and negative overvoltages at an input voltage ($V_{IN}$) with a high-voltage PMOSFET (P1) having a gate, a drain connected across a zener diode (ZD1) to the gate, and a source connected to receive an input voltage; a blocking FET (N1) having a gate connected to a power supply voltage, a drain connected across a zener diode (ZD2) to the power supply voltage, and a source connected to the gate of the high-voltage PMOSFET; a high-voltage NMOSFET (N3) having a gate connected to the power supply voltage, a source providing the protected output voltage and connected across a zener diode (ZD3) to the gate, and a drain connected to a source follower node and a level shifter circuit (214) connected between the drain of the high-voltage PMOSFET and the source follower node.

20 Claims, 5 Drawing Sheets

(56) References Cited

U.S. PATENT DOCUMENTS

2015/0270707 A1\* 9/2015 Deng .................... H02H 9/001
　　　　　　　　　　　　　　　　　　　　361/91.6
2018/0145684 A1　 5/2018 Chang et al.
2019/0273378 A1\* 9/2019 Li ......................... H02H 9/025

\* cited by examiner

HIGH SPEED WIDE DYNAMIC RANGE INPUT STRUCTURE

BACKGROUND OF THE INVENTION

Field of the Invention

The present invention is directed in general to field of protection circuitry. In one aspect, the present invention relates to an apparatus, system and method for providing high voltage protection of input circuitry in integrated circuit devices.

Description of the Related Art

It is well known that monolithic integrated circuits may become damaged by exposing their input terminals to large abnormal voltages. These large abnormal voltages can rupture the dielectric materials within the integrated devices, such as gate oxides, or can melt conductive materials, such as polysilicon or aluminum interconnects, thereby irreparably damaging the integrated circuits.

Generally, integrated circuits include protection on external pins, such as ESD devices and series resistors to clamp external voltages and limit input currents. Other protection schemes for high voltage components (FETs or similar) block (limit) the maximum voltage applied to the internal, low-voltage circuits. These traditional solutions are for one-time events (ESD) or for continuous operation, but may be non-linear, uni-directional (positive or negative excursions but not both) or have limited bandwidth and are not suitable for real-time, linear systems, such as direct fuel injection systems for gasoline and diesel internal combustion engines where it is necessary to accurately sense repetitive voltage signals with a large dynamic range (−10V-+70V) that exceed the system supply voltages.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An apparatus, system, architecture, methodology, and circuit are described for providing high speed and low offset input protection circuit against a wide dynamic range of input voltages, thereby providing bidirectional protection of the inputs of low voltage comparators and amplifiers from input voltage excursions that significantly exceed either the threshold voltage or the supply voltage(s). In operation, the input protection circuit includes a current path with protective circuit elements to provide three regions of operation (linear, positive protection, and negative protection) for use in protecting low voltage circuits from large external voltages and any excessive current which can degrade the performance of the input circuit and affect the performance of components connected to the input circuit. In particular, the input protection circuit includes a high-voltage PMOS cascode/switch that is connected to protect a low voltage input stage against negative input voltage incursions in a negative protection mode of operation. In addition, the input protection circuit includes a high-voltage NMOS cascode/switch that is connected to protect the low voltage input stage against positive input voltage excursions in a positive protection mode of operation. In addition, the input protection circuit includes a zener diode and blocking transistor to bias the PMOS cascode/switch with reverse protection, and also includes a level shifter to ensure the NMOS cascode/switch operates in Rdson mode when the input voltage is within the linear range of operation. When connected between an integrated circuit input pin and comparator input(s), the disclosed input protection circuit provides full protection against both positive and negative excursions with low current consumption, high speed performance, high input impedance, and high accuracy.

Figure 1:
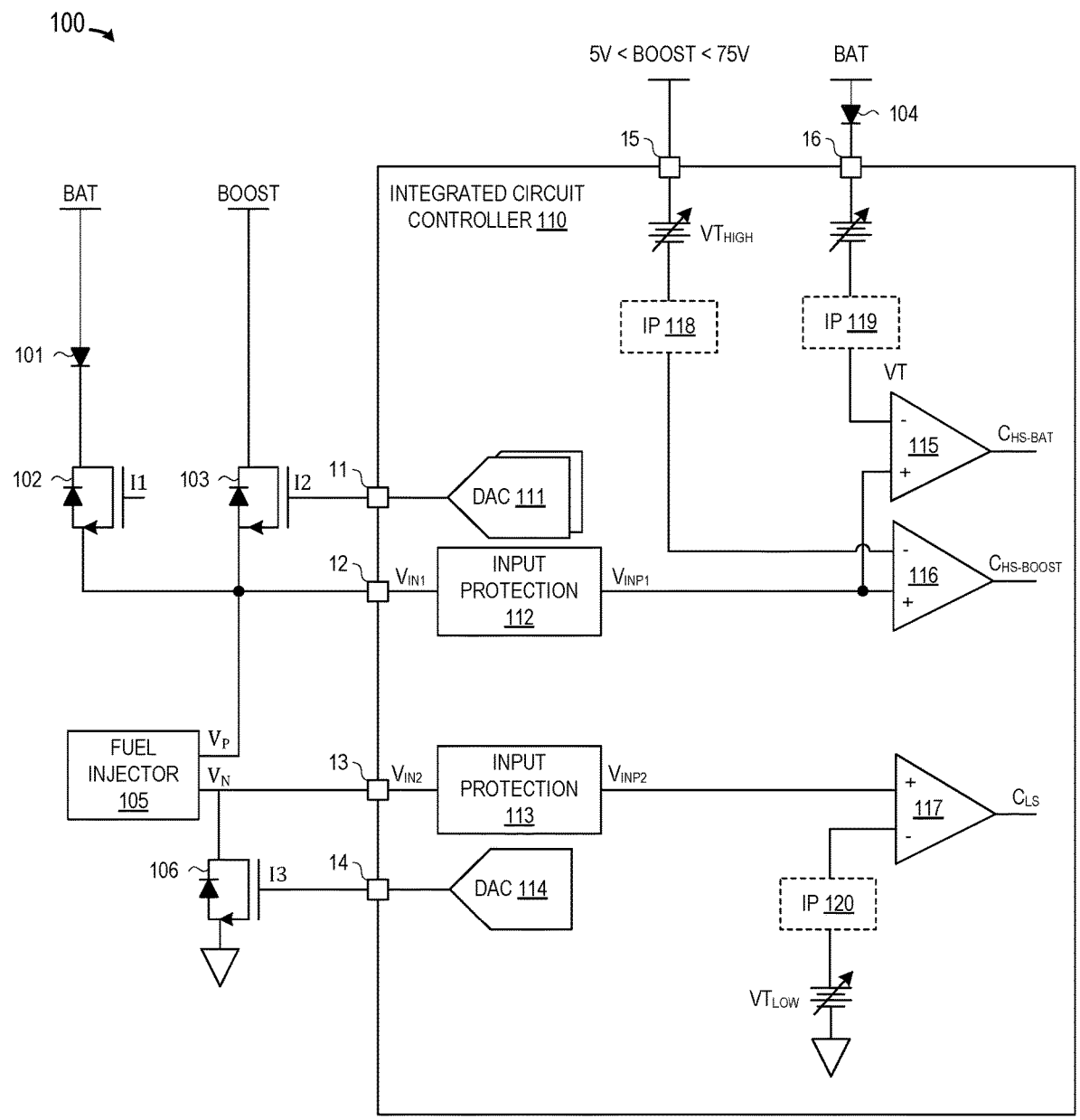
FIG. 1 depicts a simplified schematic diagram of an integrated circuit controller for a fuel injector in which one or more input circuits are protected by a high-speed dynamic range input protection circuit in accordance with selected embodiments of the present invention.

To provide additional details for an improved contextual understanding of the present disclosure, reference is now made to FIG. 1 which depicts a simplified schematic diagram 100 of a fuel injector 105 connected to an integrated circuit controller 110 in which one or more input circuits 115-117 are protected by high-speed dynamic range input protection circuitry 112, 113, 118-120. In the depicted example embodiment, the fuel injector 105 may be embodied as a next-generation direct injection fuel (DFI) system which is connected in a boosted, banked direct injector architecture to receive input signals $V_P$, $V_N$ having a wide dynamic range (e.g., from −5 V to +72 V) and a high speed of operation. To this end, the fuel injector 105 is connected, respectively, to the battery supply (BAT) and boost voltage (BOOST) via first and second NMOS switches 102, 103 which each include a body diode to provide high-side supplies under control of the gating signals I1, I2 generated by the digital-to-analog (DAC) generator(s) 111. In similar fashion, the fuel injector 105 is connected to ground via a third NMOS switch 106 which includes a body diode to provide a low-side supply under control of the gating signal I3 generated by the digital-to-analog (DAC) generator 114.

Where the operation of the fuel injector 105 requires high-speed and accurate measurements of the slew rate of turn on/off, the high and low side current feedback is provided to the controller 110 at nodes 12, 13 for evaluation by comparators, amplifiers, or similar circuits built in the integrated circuit. For example, a first comparator 115 generates a high-side comparison signal for the battery ($C_{HS\_BAT}$) by comparing the high-side input signal $V_P$ to the reference battery voltage BAT provided over the diode 104 and voltage generator VT. In addition, a second comparator 116 generates a high-side comparison signal for the boost voltage ($C_{HS\_BOOST}$) by comparing the high-side input signal $V_P$ to the reference boost voltage BOOST provided over the high-side voltage generator $VT_{HIGH}$. Finally, a third comparator 117 generates a low-side comparison signal for the ground voltage ($C_{LS}$) by comparing the low-side input signal $V_N$ to ground voltage provided over the low-side voltage generator $VT_{LOW}$. However, it will be appreciated that such comparator circuits 115-117 require input protection against voltage excursions, particularly with high voltage systems (e.g., electric cars) where the input voltages $V_P$, $V_N$ exceed the voltage levels from the voltage generators $VT_{HIGH}$, $VT_{LOW}$. Accordingly, the input voltages $V_P$, $V_N$ are connected in feedback to the input protection circuits 112, 113 before being provided to the protected inputs (e.g., non-inverting input terminals of the comparators 115-117).

In cases where the input protection circuits 112, 113 are connected to protect the non-inverting input of a comparator, there may be a voltage threshold $V_{TH}$ difference offset introduced between the input voltage $V_{IN}$ and protected input voltage $V_{INP}$ that can affect the performance of the comparator. In such cases, a replica of the input protection circuit may be connected to the inverting or reference input of the comparator to cancel this offset, as indicated with the "IP" boxes 118, 119, 120 shown with dashed lines. In particular, the input protection (IP) circuits 118, 119 each have the same circuitry as the input protection circuit 112 so that both inputs to comparators 115, 116 have matching offsets through their respective IP circuits. Likewise, the input protection (IP) circuit 120 is the same circuitry as the input protection circuit 113 so that both inputs to comparator 117 have matching offsets through their respective IP circuits.

Figure 2:
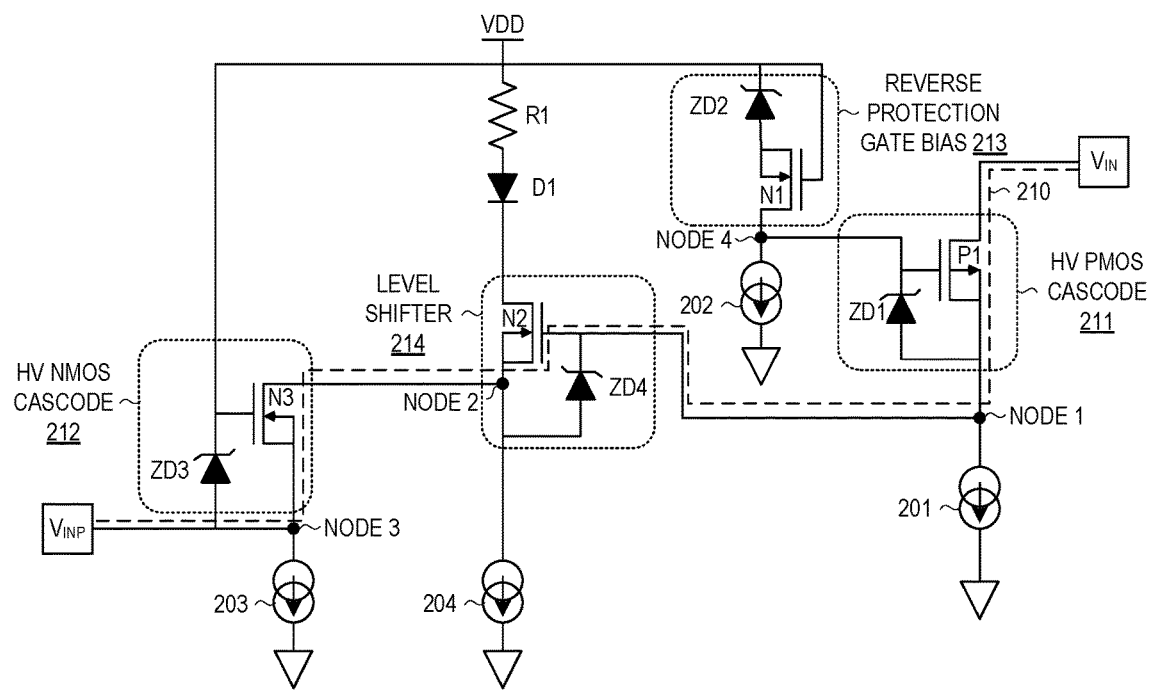
FIG. 2 depicts a schematic circuit diagram of a high-speed dynamic range input protection circuit in accordance with selected embodiments of the present invention.

To provide additional details for an improved understanding of selected embodiments of the present disclosure, reference is now made to FIG. 2 which depicts a schematic circuit diagram of a high-speed dynamic range input protection circuit 200 connected between an input terminal $V_{IN}$ and a protected input terminal $V_{INP}$. In selected embodiments, the input protection circuit 200 includes a high-voltage PMOS cascode/switch circuit 211, a high-voltage NMOS cascode/switch circuit 212, a reverse protection gate bias circuit 213, and a level shifter circuit 214, each coupled with a respective current source 201-204 between a power supply voltage (e.g., $V_{DD}$) and ground (e.g., $V_{SS}$). The high-voltage PMOS cascode/switch circuit 211 includes a PMOS FET P1 which operates as a switch in the linear range of operation for the input protection circuit 200, and which operates as both a cascode and blocking device for input voltages $V_{IN}$ less than the minimum limit of linear operation. Zener diode ZD2 sets the minimum limit of linear operation at VDD−Vzd (~5V). The reverse protection gate bias circuit 213 includes an NMOS FET N1 that provides reverse blocking when the input voltage $V_{IN}$ is greater than approximately the supply voltage (e.g., $V_{IN}$>VDD−Vgs) so that the raw input voltage $V_{IN}$ does not back feed through PMOS FET P1, ZD1 into the supply VDD. Zener diode ZD1 limits the maximum Vgs on PMOS FET P1 so that the maximum gate-source voltage is never exceeded, thereby protecting PMOS FET P1 from electrical over stress (EOS). The high-voltage NMOS cascode/switch circuit 212 includes an NMOS FET N3 which operates as a switch (or resistor) in the linear region operation for the input protection circuit 200 and for input voltages below the lower limit of the linear range of operation for the input protection circuit 200 (e.g., $V_{IN}$<VDD−Vzd−$V_{TH}$). For input voltages $V_{IN}$ greater than VDD, the NMOS FET N3 acts as a cascode and excess voltage appears across the drain-gate of the NMOS FET N3 so that it is not transmitted (passed on to) the protected input $V_{INP}$. Zener diode ZD3 limits the maximum Vgs on the NMOS FET N3 to prevent EOS. Diode D1 and resistor R1 prevent input voltages on $V_{IN}$ that exceed VDD from feeding back into the VDD supply. Zener diode ZD4 limits the maximum Vgs on the NMOS FET N2 to prevent EOS. Current sources 201-204 bias the circuit for correct operation. Current value is optional depending on supply current constraints and speed. Suitable components for circuits 211-214 include resistors, diodes, and transistors which are connected to protect the protected input terminal $V_{INP}$ from positive and negative voltage excursions on the input voltage terminal $V_{IN}$ and supply voltage $V_{DD}$ while operating within safe operating limits for such resistors, diodes, and transistors.

In connection with the present disclosure, protection against negative voltage excursions is provided by the high-voltage PMOS cascode/switch circuit 211 which is connected between the input voltage $V_{IN}$ and first current source 201, and which includes a first breakdown zener diode ZD1 having an anode connected at Node 1 to the source of the PMOS FET P1 (and first current source 201) and a cathode connected to the gate of PMOSFET P1 which has a drain connected to the input voltage $V_{IN}$. To provide reverse protection for the PMOS FET P1, the reverse protection gate bias circuit 213 is connected between the first supply voltage VDD and a second current source 202, and includes a second breakdown zener diode ZD2 having an anode connected to the drain of the NMOS FET N1 and a cathode connected to first supply voltage VDD and also to the gate of the NMOS FET N1. The source of the NMOS FET N1 is connected to the second current source 202 and also to the high-voltage PMOS cascode/switch circuit 211 at the node shared by the gate of PMOSFET P1 and the cathode of the first breakdown zener diode ZD1.

In addition, protection against positive voltage excursions is provided by the high-voltage NMOS cascode/switch circuit 212 which is connected between the first supply voltage VDD and the protected input voltage $V_{INP}$ and third current source 203, and which includes a third breakdown zener diode ZD3 having an anode connected at Node 3 to the source of the NMOS FET N3 (and third current source 203) and a cathode connected to the gate of NMOSFET N3 which has a drain connected to Node 2. To ensure that sufficient Vgs is provided at the NMOS FET N3 to behaves like a low resistance (Rdson) element when the input voltage is at the detection threshold, the level shifter circuit 214 is connected between the high-voltage NMOS cascode/switch circuit 212 (e.g., Node 2) and the high-voltage PMOS cascode/switch circuit 211 (e.g., Node 1). In particular, the level shifter circuit 214 which a fourth breakdown zener diode ZD4 having an anode connected at Node 2 to the source of the NMOS FET N2 (and fourth current source 204) and a cathode connected to the gate of NMOSFET N2 which has a drain connected over a series-connected diode D1 and resistor R1 to the first supply voltage VDD.

As disclosed herein, the high-speed dynamic range input protection circuit 200 provides a first circuit path 210 (indicated with dashed lines) for input voltages $V_{IN}$ to pass through substantially unmodified to the output ($V_{INP}$) when the input voltage is within a linear operating range of the supply voltage (e.g., VDD−Vz−$V_{TH}$<$V_{IN}$<VDD). During linear operation when input voltage $V_{IN}$, the available Zener diode voltage drop Vz across zener diodes ZD1, ZD4, ZD3 is sufficient to clamp gate oxide structures at the current path transistors P1, N2, N3. For input voltages between these limits (approximately VDD−$V_Z$ and VDD), the PFET transistor P1 behaves like a low resistance element (Rdson), the NFET transistor N2 behaves like a source follower with a threshold voltage drop $V_{TH}$, and the NFET transistor N3 also behaves like a low resistance element (Rdson). As a result, the protected input voltage $V_{INP}$ is equal to the input voltage $V_{IN}$ minus an offset or threshold voltage drop $V_{TH}$ (e.g., Vgs) across the NMOS source follower transistor N2. In applications where the input protection circuit 200 is connected to protect the non-inverting input of a comparator, the voltage threshold $V_{TH}$ difference offset between $V_{IN}$ and $V_{INP}$ can affect the performance of the comparator, in which case a replica of the input protection circuit 200 may be connected to the inverting or reference input of the comparator to cancel this offset.

In addition, the high-speed dynamic range input protection circuit 200 includes a first circuit portion 211, 213 that protects against negative-going input voltage excursions by effectively limiting the output ($V_{INP}$) to a lower clamped value (e.g., $\sim VDD-V_Z$). In the first circuit portion, the high-voltage PMOS cascode/switch circuit 211 includes the PFET transistor P1 which protects against negative excursions of the voltage input $V_{IN}$ by acting as a cascode, but which acts as a low resistance Rdson switch during normal operations. In the reverse protection gate bias circuit 213, the zener diode ZD2 biases the PFET transistor P1 to protect against negative excursions, and the NFET transistor N1 provides reverse blocking when the input voltage $V_{IN}$ exceeds the power supply voltage VDD. In the second circuit portion, the high-voltage NMOS cascode/switch circuit 212 includes the NFET transistor N3 which protects against positive excursions of the voltage input $V_{IN}$ by acting as a cascode, but which acts as a low resistance Rdson switch during normal operations. In the level shifter circuit 214, the NFET transistor N2 ensures that the gate-source voltage Vgs for the NFET transistor N3 exceeds the drain-source voltage Vds when the NFET transistor N3 operates as low resistance Rdson switch. To this end, the gate-source voltage Vgs for the NFET transistor N2 must track or be greater than the gate-source voltage Vgs for the NFET transistor N3. To protect against transients in the power supply voltage VDD, the high-speed dynamic range input protection circuit 200 may also include diode D1, resistor R1, and zener diodes ZD1, ZD3 and ZD4, as well as pull down current sources 201-204 for biasing the circuit 200 and setting the response time for falling input voltages $V_{IN}$.

Figure 3:
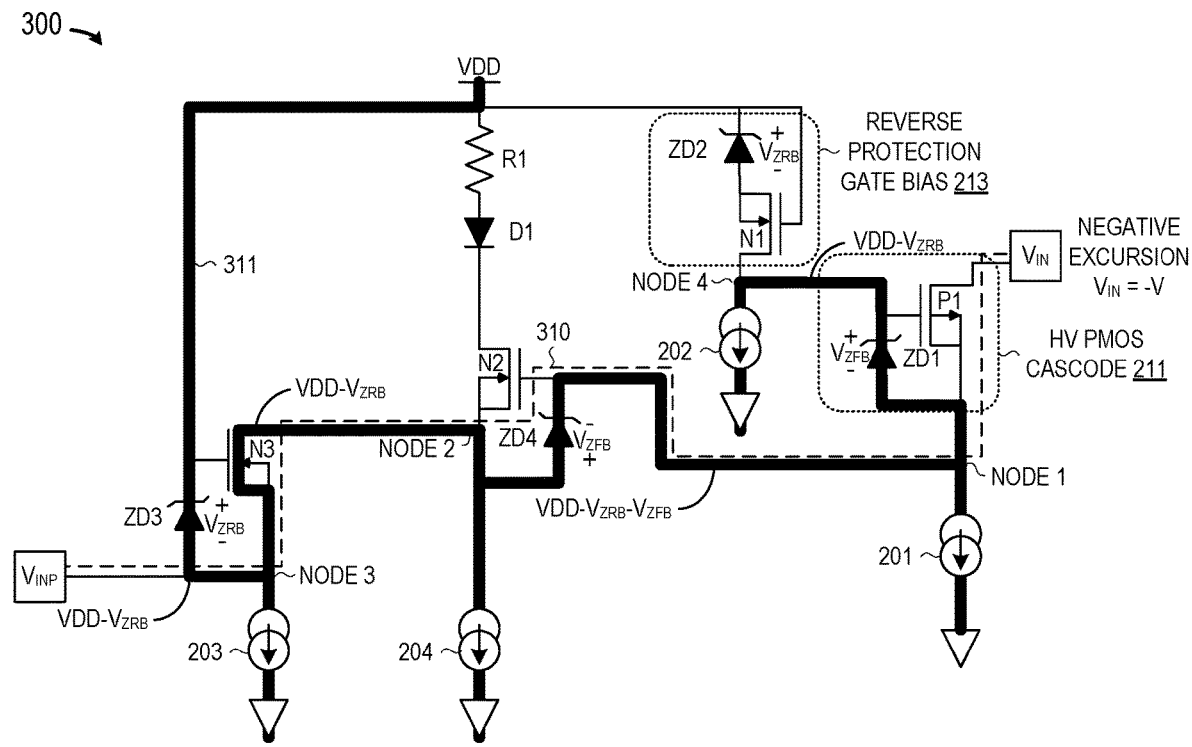
FIG. 3 depicts the operation of the high-speed dynamic range input protection circuit during a negative voltage excursion in accordance with selected embodiments of the present invention.

For an improved understanding of the operation of the high-speed dynamic range input protection circuit 200 during negative voltage excursions, reference is now made to FIG. 3 which depicts a schematic circuit diagram of the high-speed dynamic range input protection circuit 300 described with reference to FIG. 2 wherein the same reference numerals are used to denote the same elements. As depicted, the input protection circuit 300 is connected between an input terminal $V_{IN}$ and a protected input terminal $V_{INP}$, and includes a circuit path 310 (indicated with dashed lines) for the input voltage $V_{IN}$ to pass through to the output ($V_{INP}$), subject to the negative excursion protection provided by the high-voltage PMOS cascode/switch circuit 211 and reverse protection gate bias circuit 213. In particular, the highlighted current paths 311 of the input protection circuit 300 show the protective current flow which protects the output voltage $V_{INP}$ during negative excursions at the input voltage $V_{IN}$ such that the output voltage is limited to the lower clamped value (e.g., $V_{INP}=V_{DD}-V_{ZRB}$) for negative input voltage excursions down to the breakdown voltage of the PMOS FET P1. During such negative input voltage excursions, the drain of the PFET transistor P1 follows the input signal $V_{IN}$. However, negative voltage protection is provided by the PFET transistor P1 and the reverse protection gate bias circuit 213 which biases the gate of the PFET transistor P1 (Node 4) at a zener reverse bias voltage $V_{ZRB}$ below the power supply voltage (e.g., $V_{DD}-V_{ZRB}$) to prevent the gate-source oxide of the PFET transistor P1 from being damaged. With the source of the PFET transistor P1 (Node 1) being clamped to no lower than 2*Vzd below power supply voltage (e.g., $V_{DD}-V_{ZRB}-V_{ZFB}$), the PFET transistor P1 is turned OFF since its gate-source voltage $Vgs<V_{ZFB}=V_{BE}$. With NFET transistor N3 being turned ON by the supply voltage VDD and with the clamped voltage (Node 1) passing through the source-follower NFET transistor N2 to the drain of the NFET transistor N3 (Node 2), the zener diode ZD4 will limit the NFET transistor N3 (Node 3) to a zener reverse bias voltage $V_{ZRB}$ below the power supply voltage (e.g., $V_{DD}-V_{ZRB}$), and thereby clamp the protected output $V_{INP}$ (Node 3) to a similar voltage ("backwards" through the NMOS FET N3), assuming the source-drain voltage drop across the NFET transistor N3 can be ignored. As a result, the protected output voltage $V_{INP}$ is clamped to not more than $V_{DD}-V_{ZRB}$, and all circuit currents are limited and well controlled.

Figure 4:
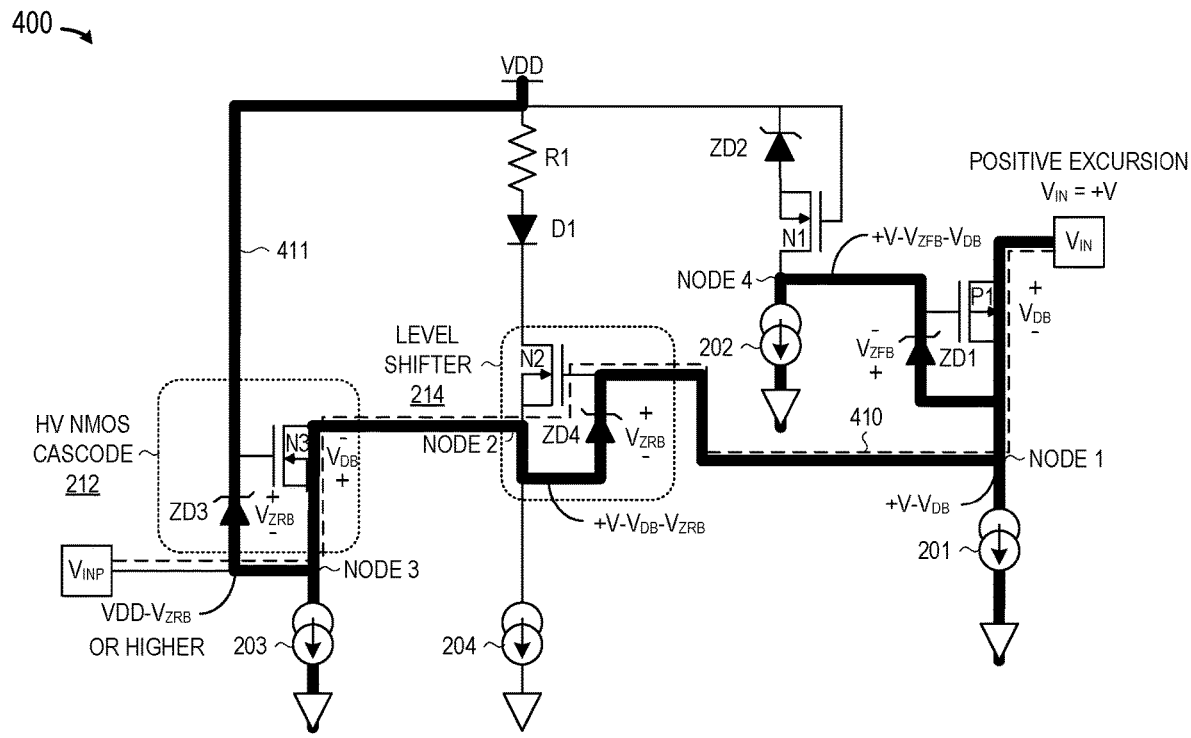
FIG. 4 depicts the operation of the high-speed dynamic range input protection circuit during a positive voltage excursion in accordance with selected embodiments of the present invention.

In addition to protecting against negative excursions, the high-speed dynamic range input protection circuit 200 includes a second circuit portion 212, 214 that protects against positive-going input voltage excursions by effectively limiting the output ($V_{INP}$) to an upper clamped value (e.g., $VDD-V_{BE}=V_{DD}-V_{ZFB}$). For an improved understanding of the operation of the high-speed dynamic range input protection circuit 200 during negative voltage excursions, reference is now made to FIG. 4 which depicts a schematic circuit diagram of the high-speed dynamic range input protection circuit 400 described with reference to FIG. 2 wherein the same reference numerals are used to denote the same elements. As depicted, the input protection circuit 400 is connected between an input terminal $V_{IN}$ and a protected input terminal $V_{INP}$, and includes a circuit path 410 (indicated with dashed lines) for an input voltage $V_{IN}$ to pass through to the protected output ($V_{INP}$) when subject to the positive excursion protection provided by the high-voltage NMOS cascode/switch circuit 212 and level shifter circuit 214. In particular, the highlighted current paths 411 of the input protection circuit 400 show the protective current flow which protects the output voltage $V_{INP}$ during positive excursions at the input voltage $V_{IN}$ (e.g., above the power supply voltage VDD) such that the output voltage is limited to the upper clamped value (e.g., $V_{INP}=VDD-V_{ZFB}$) for positive input voltage excursions up to the breakdown voltage of the NMOS FET N3. During such positive input voltage excursions, the PMOS FET P1 is turned OFF, but the voltage drop across the drain-bulk diode $V_{DB}$ of the PMOS FET P1 will allow the source of PMOS FET P1 (Node 1) to rise to the input voltage minus a diode drop voltage (+V−$V_{DB}$). Across the forward biased zener diode ZD1, the voltage at Node 4 (e.g., Node 1=+V−$V_{DB}$−$V_{ZFB}$) where the NMOS FET N1 will be turned OFF to prevent current flowing. However, the Node 1 voltage will also pass over the reverse biased zener diode ZD4 to the NMOS source follower transistor N2. If the input voltage $V_{IN}$ is more than a Zener voltage above the power supply voltage (e.g., $V_{IN} \geq V_{DD}+V_{ZRB}$), the diode D1 and resistor R1 will prevent the NMOS cascode/switch circuit 212 from clamping to the power supply voltage VDD. As a result, the input signal (Node 2) will then pass to the NMOS FET N3 which has its gate at the power supply voltage VDD, and is thereby turned ON to clamp the protected output voltage $V_{INP}$ to $V_{DD}-V_{ZRB}$ and withstand positive voltages up to its BVDSS capability.

Although the field effect transistor P1 is shown as being a PMOS transistor having a first or "n" polarity type and the field effect transistors N1-N3 are shown as being NMOS transistors having a second or "p" polarity type, this is not a limitation of the present invention. As a result, the functionality of the input protection circuit can be maintained by reversing the polarity types of the transistors P1 and N1-N3 and swapping the power supply voltage (e.g., $V_{DD}$) and ground (e.g., $V_{SS}$).

Figure 5:
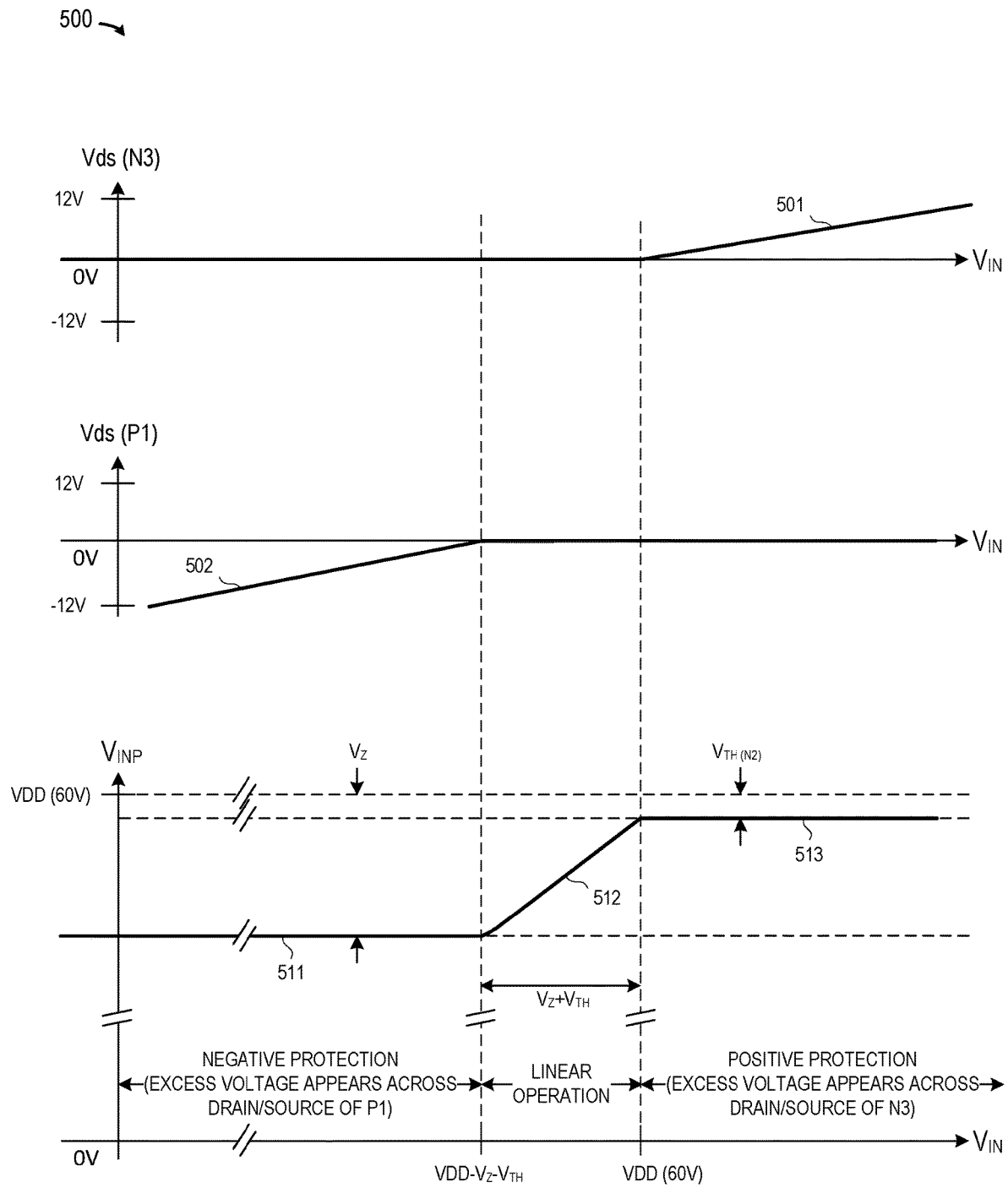
FIG. 5 graphically depicts voltage waveforms to illustrate the transfer function of the protected input voltage versus the input voltage for linear, positive protection, and negative protection regions of operation in accordance with selected embodiments of the present invention.

For an improved understanding of the operation of the high-speed dynamic range input protection circuit in accordance with selected embodiments of the present disclosure, reference is now made to FIG. 5 which graphically depicts cascode behavior of the high voltage PMOS and NMOS transistors along with the transfer function of the protected output voltage ($V_{INP}$) generated by the high-speed dynamic range input protection circuit as a function of the input voltage ($V_{IN}$) for linear, positive protection, and negative protection regions of operation. As depicted with the waveform 501, drain-source voltage Vds of the high-voltage NMOSFET N3 acts as a resistor below a first input voltage transition point located at the supply voltage VDD, and acts as a cascode above the first input voltage transition point at. And as depicted with the waveform 502, drain-source voltage Vds of the high-voltage PMOSFET P1 acts as a resistor above a second input voltage transition point located at or near a zener reverse bias voltage $V_{ZRB}$ below the power supply voltage $V_{DD}$ (or more specifically, $V_{DD}-V_{ZRB}-V_{TH}$), and acts as a cascode below the second input voltage transition point (or more specifically, $V_{DD}-V_{ZRB}-V_{TH}$). As a result, when both transistors N3 and P1 are acting as resistors, the protected output voltage ($V_{INP}$) is operating in a linear relationship to the input voltage ($V_{IN}$), though offset by a threshold voltage (e.g., $V_{TH}$) for the NMOSFET N2. However, when the high voltage PMOSFET P1 is acting as a cascode, the input protection circuit provides negative or low voltage protection against negative excursions below the linear operation voltage range. And when the high voltage NMOSFET N3 is acting as a cascode, the input protection circuit provides positive or high voltage protection against positive excursions above the linear operation voltage range. This behavior is depicted with the simulated plot of the protected output voltage ($V_{INP}$) which is limited by the first cascode switch P1 to a lower value (e.g., $V_{INP}=VDD-V_Z$) when there is a negative excursion by the input voltage ($V_{IN}$) below the normal voltage operating range (e.g., $V_{IN}<VDD-V_Z-V_{TH}$). And when the input voltage ($V_{IN}$) is within the normal voltage operating range (e.g., $VDD-V_Z-V_{TH}<V_{IN}<VDD$), the protected output voltage has a linear offset function with respect to the input voltage ($V_{INP}=V_{IN}-V_{TH}=V_{IN}-Vgs$). Finally, when the input voltage ($V_{IN}$) exceeds the normal voltage operating range (e.g., $V_{IN}>VDD$), the protected output voltage ($V_{INP}$) is limited by the second cascode switch N3 to an upper value (e.g., $V_{INP}=VDD-V_{TH}$) to protect against positive excursions by the input voltage ($V_{IN}$).

As described hereinabove, the signal paths 210, 310, 410 show the signal path from the input ($V_{IN}$) to the output ($V_{INP}$) for all three modes of operation providing negative protection, linear operation and positive protection. This is achieved by using the zener diodes ZD1, ZD2 to set the maximum gate-source voltage Vgs on the respective FETs P1, N1 which are connected thereto. While current may flow in the zener diodes ZD1, ZD2, this is not the signal path. In addition, diode D1 and resistor R1 provide reverse protection when the input voltage $V_{IN}>>VDD$. As seen from the foregoing, when the input voltage $V_{IN}$ is in the normal, linear operating range, the MOSFETs P1 and N3 are switches (resistors) and the MOSFET N2 is a level shifter or source follower. In this linear operation range, the minimum and maximum values for the input voltage $V_{IN}$ is defined as $VDD-Vzd2-V_{TH} \leq V_{IN} \leq VDD$. However, when the input voltage $V_{IN}$ is below the minimum voltage for linear operation (e.g., $VDD-Vzd2-V_{TH}$), the disclosed input protection circuit provides negative or low voltage (LV) protection so that the PMOS FET P1 is in cut-off (AbsVal Vgs<0V) and the NMOS FET N3 operates as a switch. And when the input voltage $V_{IN}$ is above the maximum voltage for linear operation (e.g., VDD), the disclosed input protection circuit provides positive or high voltage (HV) protection so that the PMOS FET P1 operates as a switch and the NMOS FET N3 operates as a cascode. When acting as a switch, the drain-source voltage Vds on the MOSFETs P1 and N3 is small. When acting as a cascode, the gate-source voltage Vgs is fixed or limited by the zener diode so that the drain-source voltage can be very large so that it stretches to the limit voltage. When in cut-off mode where the MOSFET is OFF, the gate-source voltage Vgs<VT, and the drain-source voltage Vds can be as large as the FET rating. With the MOSFETs P1 and N3 being constructed as high voltage FETs, the resulting input protection circuit provides protection/blocking against large excursion voltages.

By now it should be appreciated that there has been provided an input protection circuit, apparatus, method, and system for generating a protected output voltage (VINP) from positive and negative overvoltages at an input voltage (VIN). The disclosed input protection circuit includes a first cascode switch to limit the output voltage when input voltage excursions are below a specified voltage operation range comprising a high-voltage PMOS field effect transistor (PMOSFET) having a gate or control electrode, a drain or first current carrying electrode connected across a first zener diode to the control electrode, and a source or second current carrying electrode connected to receive an input voltage. The input protection circuit also includes a blocking field effect transistor (FET) having a gate or control electrode connected to a power supply voltage, a drain or first current carrying electrode connected across a second zener diode to the power supply voltage, and a source or second current carrying electrode connected to the control electrode of the high-voltage PMOSFET. In addition, the input protection circuit includes a second cascode switch to limit the output voltage when input voltage excursions are above the specified voltage operation range comprising a high-voltage NMOS field effect transistor (NMOSFET) having a gate or control electrode connected to the power supply voltage, a source or first current carrying electrode providing the output voltage and connected across a third zener diode to the control electrode, and a drain or second current carrying electrode connected to a source follower node. The input protection circuit also includes a level shifter circuit connected between the first current carrying electrode of the high-voltage PMOSFET and the source follower node. In selected embodiments, the level shifter circuit includes a transistor (e.g., an NMOSFET) having a control electrode connected to the first current carrying electrode of the high-voltage PMOSFET, a first current carrying electrode connected with the source follower node across a fourth zener diode to the control electrode of the transistor, and a second current carrying electrode coupled over a diode to the power supply voltage. In selected embodiments, the diode has a cathode connected to the second current carrying electrode of the NMOSFET and an anode connected over a resistor to the power supply voltage. To set response times to falling input voltage, each of the high-voltage PMOSFET, blocking FET, high-voltage NMOSFET, and transistor may be separately connected to a second power supply voltage by a current source circuit. In selected embodiments of the disclosed input protection circuit, the high-voltage PMOSFET is connected to protect against negative input voltage excursions that significantly exceed a gate-oxide breakdown voltage of the high-voltage PMOSFET, where the negative input voltage excursions may be voltages below the power supply voltage by at least a reverse bias voltage of the first zener diode. In addition, the high-voltage NMOSFET may be connected to protect against positive input voltage excursions that significantly exceed a gate-oxide breakdown voltage of the high-voltage NMOSFET, where the positive input voltage excursions may be voltages exceeding the power supply voltage.

In another form, there is provided a method, circuit, apparatus, and system for protecting a circuit input from input voltage fluctuations at a voltage input. In the disclosed methodology, the voltage input is connected to the circuit input over a signal path in a protection circuit that includes a first cascode switch, a level shifter, and a second cascode switch connected in series between the voltage input and circuit input. The disclosed methodology also uses the protection circuit to generate an output voltage at the circuit input that is a threshold voltage below the input voltage when the input voltage at the voltage input is within a specified voltage range for linear operation of the protection circuit. In particular, the first cascode switch is connected between a first current source and a blocking field effect transistor connected to a power supply voltage, thereby providing negative voltage excursion protection at the circuit input when the input voltage at the voltage input is below a specified voltage range for linear operation of the protection circuit. In selected embodiments, the first cascode switch includes a high-voltage PMOS field effect transistor (PMOSFET) having a control electrode, a first current carrying electrode connected across a first zener diode to the control electrode, and a second current carrying electrode connected to the voltage input to receive input voltage. In addition, the second cascode switch is connected between a second current source and the power supply voltage, thereby providing positive voltage excursion protection at the circuit input when the input voltage at the voltage input is above the specified voltage range for linear operation of the protection circuit. In selected embodiments, the second cascode switch includes a high-voltage NMOS field effect transistor (NMOSFET) having a control electrode connected to the power supply voltage, a first current carrying electrode providing the circuit input and connected across a third zener diode to the control electrode, and a second current carrying electrode connected to a source follower node. In addition, the blocking field effect transistor (FET) may be connected between a fourth current source and the power supply voltage and comprises a control electrode connected to the power supply voltage, a first current carrying electrode connected across a second zener diode to the power supply voltage, and a second current carrying electrode connected to the control electrode of the high-voltage PMOSFET. In addition, the level shifter is connected between a third current source and a resistor circuit connected to the power supply voltage, thereby operating as a source follower with a threshold voltage drop $V_{TH}$. In selected embodiments, the level shifter circuit includes a transistor having a control electrode connected to the first current carrying electrode of the high-voltage PMOSFET, a first current carrying electrode comprising the source follower node that is connected across a fourth zener diode to the control electrode of the transistor, and a second current carrying electrode connected to the resistor circuit. In the disclosed method, the first cascode switch is connected to protect against negative input voltage excursions that significantly exceed a gate-oxide breakdown voltage of the high-voltage PMOSFET. In addition, the second cascode switch is connected to protect against positive input voltage excursions exceeding the power supply voltage.

In yet another form, there is provided an input protection circuit, method, apparatus, and system for generating a protected output voltage from an input voltage received at a voltage input. The disclosed input protection circuit includes a first cascode switch, a second cascode switch, a blocking field effect transistor, and a level shifter circuit. The disclosed first cascode switch includes a high-voltage FET of a first polarity type having a control electrode, a first current carrying electrode connected across a first zener diode to the control electrode, and a second current carrying electrode connected to receive the input voltage, and is connected between a first current source and a blocking field effect transistor connected to a power supply voltage, thereby providing negative voltage excursion protection at the output voltage when the input voltage is below a specified voltage range for linear operation of the input protection circuit. The disclosed second cascode switch includes a high-voltage FET of a second polarity type having a control electrode connected to the power supply voltage, a first current carrying electrode providing the output voltage and connected across a second zener diode to the control electrode, and a second current carrying electrode connected to a source follower node, and is connected between a second current source and the power supply voltage, thereby providing positive voltage excursion protection at the output voltage when the input voltage is above a specified voltage range for linear operation of the input protection circuit. The disclosed blocking field effect transistor includes a field effect of the second polarity type having a control electrode connected to a power supply voltage, a first current carrying electrode connected across a third zener diode to the power supply voltage, and a second current carrying electrode connected to the control electrode of the high-voltage FET of the first polarity type. Connected between a third current source and the power supply voltage, the blocking field effect transistor provides reverse protection gate bias to the high-voltage FET of the first polarity type. The disclosed a level shifter circuit is connected between a fourth current source and a resistor circuit connected to the power supply voltage, thereby operating as a source follower between the first current carrying electrode of the high-voltage FET of the first polarity type and the source follower node. In selected embodiments, the high-voltage FET of the first polarity type is a PMOS field effect transistor, and the high-voltage FET of the second polarity type is an NMOS field effect transistor. In other embodiments, the high-voltage FET of the first polarity type is an NMOS field effect transistor, and the high-voltage FET of the second polarity type is a PMOS field effect transistor. In selected embodiments, the power supply voltage is a first reference voltage VDD, and in other embodiments, the power supply voltage is a ground reference voltage VSS, based on the polarity type of the field effect transistors.

Although the described exemplary embodiments disclosed herein focus on an input protection circuit having a specified supply voltage range (e.g., 5V to 65V) with component transistors, zener diodes, and current sources operating within safe operating areas to provide a method of protecting an input from positive and negative overvoltages having a dynamic range of −5V to +72V that exceeds the gate-oxide limits of the component transistors in the input protection circuit, the present invention is not necessarily limited to the example embodiments illustrate herein and may be applied to any suitable input protection system which protects against positive and negative input voltage excursions with a high speed, low current, high input impedance input protection circuit that can be manufactured using standard semiconductor processing techniques. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the p articular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An input protection circuit for generating an output voltage in response to an input voltage, comprising:
    a first cascode switch to limit the output voltage when input voltage excursions are below a specified voltage operation range comprising a high-voltage PMOS field effect transistor (PMOSFET) having a control electrode, a first current carrying electrode connected across a first zener diode to the control electrode, and a second current carrying electrode connected to receive an input voltage;
    a blocking field effect transistor (FET) having a control electrode connected to a power supply voltage, a first current carrying electrode connected across a second zener diode to the power supply voltage, and a second current carrying electrode connected to the control electrode of the high-voltage PMOSFET;
    a second cascode switch to limit the output voltage when input voltage excursions are above the specified voltage operation range comprising a high-voltage NMOS field effect transistor (NMOSFET) having a control electrode connected to the power supply voltage, a first current carrying electrode providing the output voltage and connected across a third zener diode to the control electrode, and a second current carrying electrode connected to a source follower node; and
    a level shifter circuit connected between the first current carrying electrode of the high-voltage PMOSFET and the source follower node.

2. The input protection circuit of claim 1, where the level shifter circuit comprises a transistor having a control electrode connected to the first current carrying electrode of the high-voltage PMOSFET, a first current carrying electrode comprising the source follower node that is connected across a fourth zener diode to the control electrode of the transistor, and a second current carrying electrode coupled over a diode to the power supply voltage.

3. The input protection circuit of claim 2, where each of the high-voltage PMOSFET, blocking FET, high-voltage NMOSFET, and transistor is separately connected to a second power supply voltage by a current source circuit.

4. The input protection circuit of claim 2, where the transistor comprises an NMOS field effect transistor (NMOSFET).

5. The input protection circuit of claim 4, where the diode has a cathode connected to the second current carrying electrode of the NMOSFET and an anode connected over a resistor to the power supply voltage.

6. The input protection circuit of claim 1, where the high-voltage PMOSFET is connected to protect against negative input voltage excursions that significantly exceed a gate-oxide breakdown voltage of the high-voltage PMOSFET.

7. The input protection circuit of claim 6, where the negative input voltage excursions are voltages below the power supply voltage by at least a reverse bias voltage of the first zener diode.

8. The input protection circuit of claim 1, where the high-voltage NMOSFET is connected to protect against positive input voltage excursions that significantly exceed a gate-oxide breakdown voltage of the high-voltage NMOSFET.

9. The input protection circuit of claim 8, where the positive input voltage excursions are voltages exceeding the power supply voltage.

10. A method for protecting a circuit input from input voltage fluctuations at a voltage input, comprising:
    connecting the voltage input to the circuit input over a signal path in a protection circuit comprising a first cascode switch, a level shifter, and a second cascode switch connected in series between the voltage input and circuit input; and
    generating, by the protection circuit, an output voltage at the circuit input that is a threshold voltage below the input voltage when the input voltage at the voltage input is within a specified voltage range for linear operation of the protection circuit;
    wherein the first cascode switch is connected between a first current source and a blocking field effect transistor connected to a power supply voltage to provide negative voltage excursion protection at the circuit input when the input voltage at the voltage input is below a specified voltage range for linear operation of the protection circuit,
    wherein the second cascode switch is connected between a second current source and the power supply voltage to provide positive voltage excursion protection at the circuit input when the input voltage at the voltage input is above the specified voltage range for linear operation of the protection circuit, and
    wherein the level shifter is connected between a third current source and a resistor circuit connected to the power supply voltage to operate as a source follower with a threshold voltage drop $V_{TH}$.

11. The method of claim 10, where the first cascode switch comprises a high-voltage PMOS field effect transistor (PMOSFET) having a control electrode, a first current carrying electrode connected across a first zener diode to the control electrode, and a second current carrying electrode connected to the voltage input to receive input voltage.

12. The method of claim 11, where the blocking field effect transistor (FET) is connected between a fourth current source and the power supply voltage and comprises a control electrode connected to the power supply voltage, a first current carrying electrode connected across a second zener diode to the power supply voltage, and a second current carrying electrode connected to the control electrode of the high-voltage PMOSFET.

13. The method of claim 12, where the second cascode switch comprises a high-voltage NMOS field effect transistor (NMOSFET) having a control electrode connected to the power supply voltage, a first current carrying electrode providing the circuit input and connected across a third zener diode to the control electrode, and a second current carrying electrode connected to a source follower node.

14. The method of claim 13, where the level shifter circuit comprises a transistor having a control electrode connected to the first current carrying electrode of the high-voltage PMOSFET, a first current carrying electrode comprising the source follower node that is connected across a fourth zener diode to the control electrode of the transistor, and a second current carrying electrode connected to the resistor circuit.

15. The method of claim 11, wherein the first cascode switch is connected to protect against negative input voltage excursions that significantly exceed a gate-oxide breakdown voltage of the high-voltage PMOSFET.

16. The method of claim 11, wherein the second cascode switch is connected to protect against positive input voltage excursions exceeding the power supply voltage.

17. An input protection circuit for generating an output voltage from an input voltage received at a voltage input, comprising:
  a first cascode switch connected between a first current source and a blocking field effect transistor connected to a power supply voltage, where the first cascode switch provides negative voltage excursion protection at the output voltage when the input voltage is below a specified voltage range for linear operation of the input protection circuit, where the first cascode switch comprises a high-voltage FET of a first polarity type having a control electrode, a first current carrying electrode connected across a first zener diode to the control electrode, and a second current carrying electrode connected to receive the input voltage;
  a second cascode switch connected between a second current source and the power supply voltage, where the second cascode switch provides positive voltage excursion protection at the output voltage when the input voltage is above a specified voltage range for linear operation of the input protection circuit, where the second cascode switch comprises a high-voltage FET of a second polarity type having a control electrode connected to the power supply voltage, a first current carrying electrode providing the output voltage and connected across a second zener diode to the control electrode, and a second current carrying electrode connected to a source follower node;
  a blocking field effect transistor (FET) of the second polarity type connected between a third current source and the power supply voltage to provide reverse protection gate bias to the high-voltage FET of the first polarity type, where the blocking FET comprises a control electrode connected to a power supply voltage, a first current carrying electrode connected across a third zener diode to the power supply voltage, and a second current carrying electrode connected to the control electrode of the high-voltage FET of the first polarity type; and
  a level shifter circuit connected between a fourth current source and a resistor circuit connected to the power supply voltage, where the level shifter circuit operates as a source follower between the first current carrying electrode of the high-voltage FET of the first polarity type and the source follower node.

18. The input protection circuit of claim 17, where the high-voltage FET of the first polarity type comprises a PMOS field effect transistor, and where the high-voltage FET of the second polarity type comprises an NMOS field effect transistor.

19. The input protection circuit of claim 17, where the high-voltage FET of the first polarity type comprises an NMOS field effect transistor, and where the high-voltage FET of the second polarity type comprises a PMOS field effect transistor.

20. The input protection circuit of claim 17, where the power supply voltage comprises a first reference voltage VDD or a ground reference voltage VSS.

* * * * *